United States Patent

[11] 3,632,436

[72] Inventor Richard Denning
Springfield, N.J.
[21] Appl. No. 841,053
[22] Filed July 11, 1969
[45] Patented Jan. 4, 1972
[73] Assignee RCA Corporation

[54] CONTACT SYSTEM FOR SEMICONDUCTOR DEVICES
3 Claims, 13 Drawing Figs.

[52] U.S. Cl. 117/212, 117/217, 317/234 M
[51] Int. Cl. C23c 3/02, H01l 7/00
[50] Field of Search 317/234 (5); 117/212, 217

[56] References Cited
UNITED STATES PATENTS

| | | | |
|---|---|---|---|
| 3,523,038 | 8/1970 | Sanders | 117/212 |
| 3,460,007 | 8/1969 | Scott | 317/234 X |
| 3,375,417 | 3/1968 | Hull, Jr. et al. | 317/234 |
| 3,189,973 | 6/1965 | Edwards et al. | 317/234 |
| 2,793,420 | 5/1957 | Johnston et al. | 317/240 X |

*Primary Examiner*—Alfred L. Leavitt
*Assistant Examiner*—Alan Grimaldi
*Attorney*—Glenn H. Bruestle

ABSTRACT: A method of providing a silicon semiconductor device having an oxide passivation layer, with a nickel-lead (NiPb) contact system comprising: depositing either an epitaxial layer or a polycrystalline layer of silicon on top of the oxide layer in the desired contact pattern, depositing a thin film of nickel electrolessly on the silicon layer but not on the oxide, and depositing a layer of lead solder on the silicon layer but not on the oxide layer.

INVENTOR
RICHARD DENNING

BY W. S. Hill
Agent

INVENTOR.
RICHARD DENNING
BY
W. S. Hill
Agent

INVENTOR
RICHARD DENNING

BY W. S. Hill
Agent

INVENTOR
RICHARD DENNING

BY W. S. Hill
Agent

CONTACT SYSTEM FOR SEMICONDUCTOR DEVICES

BACKGROUND OF THE INVENTION

Semiconductor devices, such as silicon transistors, having passivating layers of silicon dioxide over their junction-containing surface, usually have electrode contact systems comprising evaporated aluminum. The aluminum is usually deposited over the entire surface of the device and then, by photomasking and etching procedure, aluminum is removed except from the exposed surfaces of emitter and base electrodes and from paths connecting these electrode surfaces to bonding pads on the edges of the semiconductor chip. Aluminum is preferred for this type of evaporated electrode system for a number of reasons. It evaporates readily, it bonds well to both silicon and silicon dioxide, it has low electrical resistance, and it ordinarily has no adverse effects on the electrical characteristics of low-power devices.

However, aluminum does have some disadvantages as a contact metal for transistor electrodes. It does not solder well and wire leads are usually joined to it by thermocompression bonding. This is a tedious task requiring skilled operators and is therefore costly. Moreover, in high-power transistors, considerable heat may be generated around the periphery of the emitter electrode. The heat may be sufficient to cause the aluminum to alloy with the silicon and aluminum "spikes" may penetrate the device and short out the emitter-base junction.

In some kinds of power transistors, emitter and base contacts are made with a nickel-lead solder metallizing system and rigid metal bridging leads. This type of system comprises a thin film of nickel on the silicon body electrode surface and a thick layer of Pb-Sn solder overlying the nickel. The solder can be applied by an inexpensive dipping operation and wire or ribbon type leads can be embedded in the solder also by an inexpensive mass production operation. Moreover, the nickel does not form a eutectic alloy with silicon at temperatures below 835° C. and therefore is more desirable than aluminum, eutectic 550° C., for power devices.

It would be advantageous to apply the nickel-lead solder system to contacts of the type that extend over the surface of a silicon dioxide passivating layer; and now, with the present invention, a method has been provided for doing this.

THE DRAWING

Figure 7:
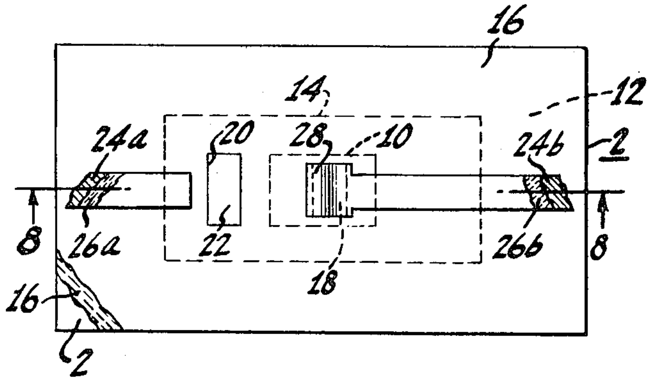
FIG. 7 is a plan view of the device of the preceding figures at a later stage of manufacture.
Figure 8:
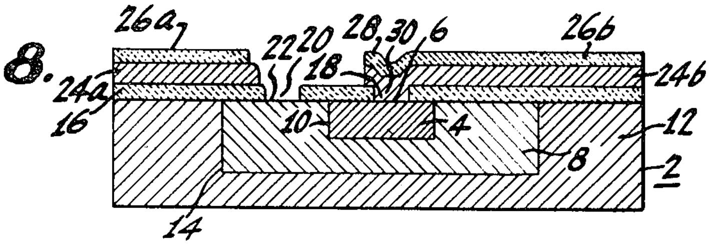
Figure 9:
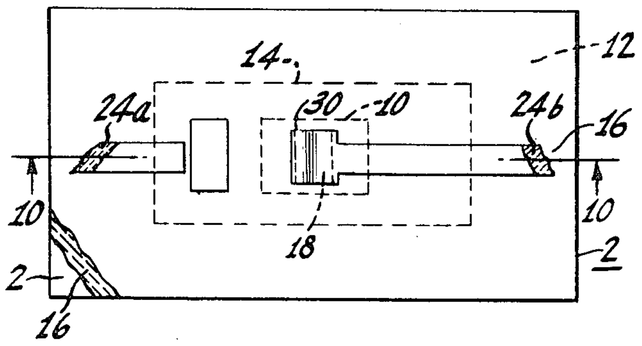
Figure 10:
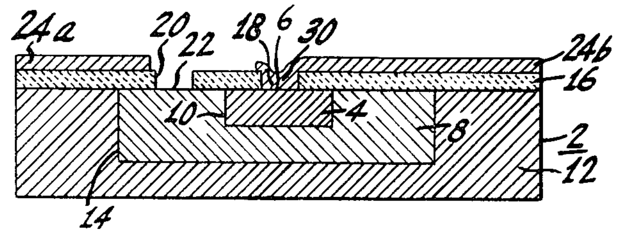

FIG. **7*a* is a perspective view of the device of FIG. 7**;

FIG. 8 is a section view taken along the line 8—8 of FIG. 7;

FIG. 9 is another plan view of the device of the preceding figures taken at a still later stage of manufacture;

FIG. 10 is a section view taken along the line 10—10 of FIG. 9, and

Figure 11:
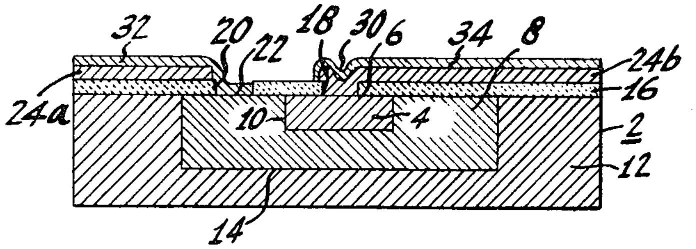
Figure 12:
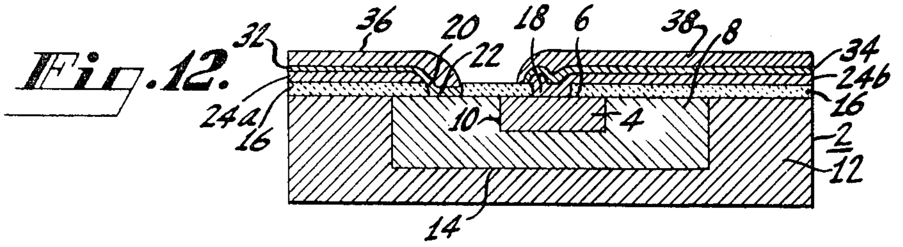

FIGS. 11 and 12 are section views of final stages of manufacturing the device illustrated in the preceding figures.

DESCRIPTION OF A PREFERRED EMBODIMENT

Figure 1:
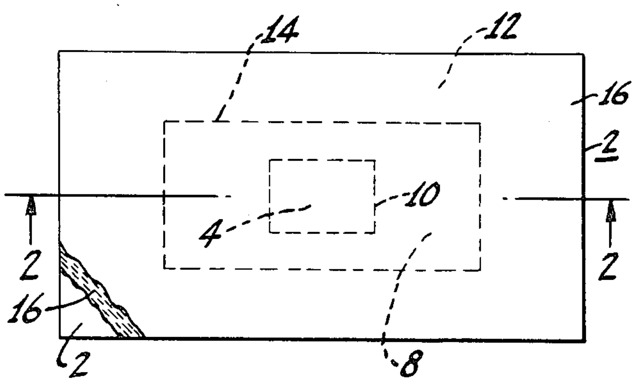
FIG. 1 is a top plan view, partly broken away, of a semiconductor device illustrating an early step in the manufacture of a device in accordance with the present invention.
Figure 2:
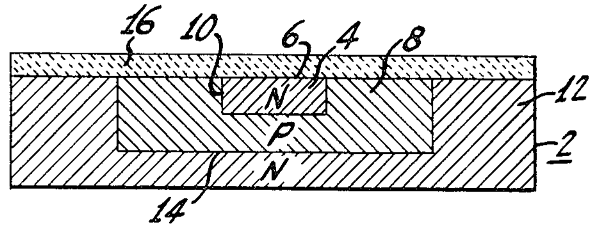
FIG. 2 is a section view taken along the line 2—2 of FIG. 1.

A method, in accordance with the invention, will now be described with the aid of the drawing. The method will be described in connection with the manufacture of a common type of diffused-junction transistor. As shown in FIGS. 1 and 2, the transistor may comprise a silicon semiconductor body 2, part of which comprises an N-type emitter region 4 having a surface 6 which coincides with part of a major surface of the body 2. The device also includes a P-type base region 8 surrounding the emitter region 4. A PN-junction 10, between the emitter region 4 and base region 8, extends to the top surface of the silicon body 2. The device also includes an N-type collector region 12 separated from the base region 8 by a PN-junction 14 which also extends to the top surface of the body 2.

A first step in the manufacture of the device, after forming the base and emitter regions described above, by diffusion, is to apply a relatively thick passivating layer 16 of silicon dioxide to the top surface of the body 2. This can be done by the conventional method of steam growth at about 1,250° C. for 90 minutes. This produces an oxide coating having a thickness of about 10,000–20,000 A.

Figure 3:
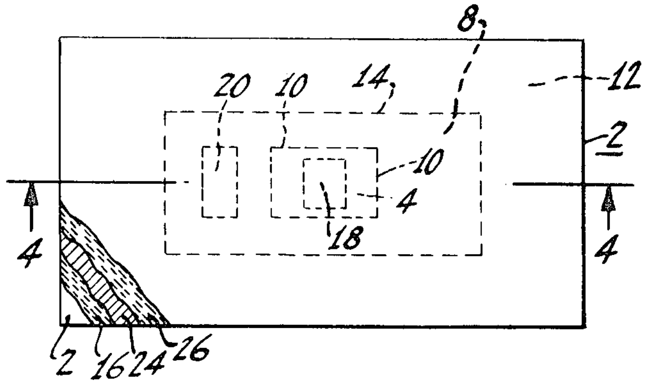
FIG. 3 is a plan view, partially broken away, similar to that of FIG. 1, illustrating an intermediate stage in the manufacture of a device in accordance with the present invention.
Figure 4:
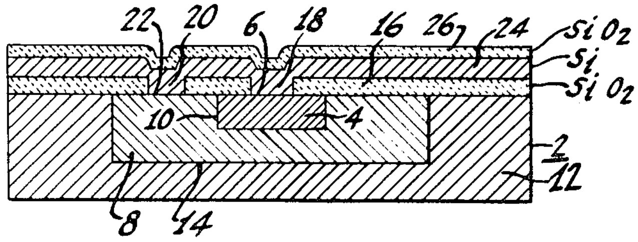
FIG. 4 is a section view taken along the line 4—4 of FIG. 3.

Next, an emitter opening 18 and a base region opening 20 may be formed in the silicon dioxide layer 16 by conventional photomasking and etching techniques (FIGS. 3 and 4). Etching of the oxide may be carried out using a solution comprising 163 cc. Forty-nine percent concentrated hydrofluoric acid, 454 g. ammonium fluoride and 680 cc. water. This solution is capable of etching at a rate of about 1,000 A./min. The emitter opening 18 exposes the surface 6 of emitter region 4 and base opening 20 exposes a surface portion 22 of base region 8. After the etching is complete, the overlying layer of photoresist is removed.

After the removal of the photoresist, a layer of silicon 24 is deposited over the entire top surface of the silicon body on both the silicon dioxide layer and in the emitter and base openings 18 and 20. Part of this silicon layer therefore deposits on the exposed emitter surface 6 and the exposed base surface 22.

The silicon layer 24 may be either epitaxial or polycrystalline. If it is desired to use the silicon layer only as part of an ohmic contact system, it may be epitaxial. The epitaxial layer may be grown by reducing $SiCl_4$ with hydrogen at a temperature of about 1,100°–1,250° C. Thickness of the silicon layer 24 may be 1,000–20,000 A. with about 10,000 A. being preferred. A polycrystalline silicon layer is preferred if that part of it within emitter opening 18 is to be used as an emitter ballast resistor. A polycrystalline silicon layer may be deposited by decomposing $SiH_4$ at a temperature of about 800° C. or above.

The next step is to grow a very thin layer of silicon dioxide 26 over the silicon layer 24. This may be done by steam oxidation growth at 1,000° C. for 3–5 minutes. Under these conditions a layer about 500 A. thick is formed.

Figure 5:
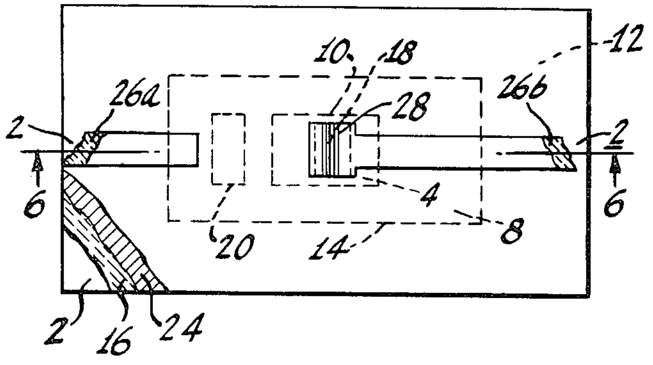
FIG. 5 is a plan view, partially broken away, similar to that of FIGS. 1 and 3, illustrating another intermediate stage in the manufacture of a device in accordance with the present invention.
Figure 6:
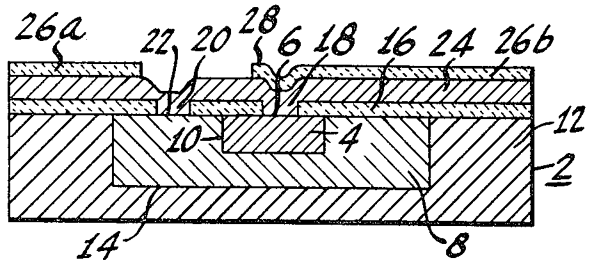
FIG. 6 is a section view taken along the line 6—6 of FIG. 5.

By a conventional photomasking and etching technique, the thin top layer of silicon dioxide 26 is removed except where a pattern of conducting leads is desired. As shown in FIGS. 5 and 6, this pattern of leads may comprise a base lead stripe **26*a* of oxide and an emitter lead stripe 26*b*. The emitter lead oxide stripe 26*b* may have a widened end portion 28** covering the area above the emitter opening.

Figure 7A:
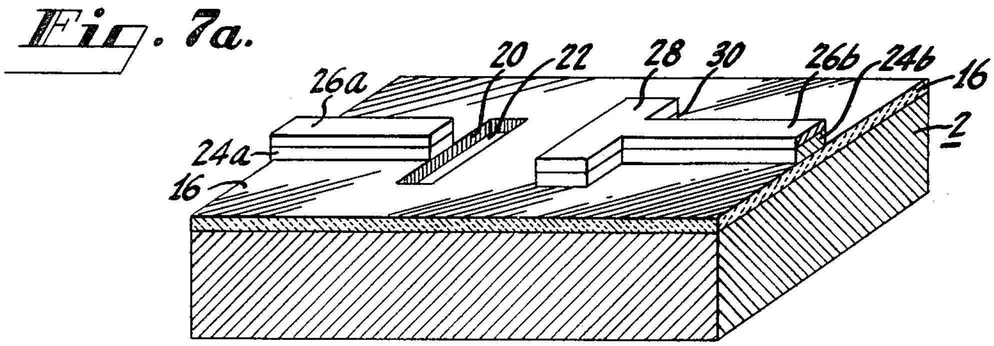

Next, the silicon layer 24 is removed by etching in 10 percent sodium hydroxide solution at 80°–100° C. except where masked by the silicon dioxide stripes **26*a* and 26*b*. This leaves a base lead stripe 24*a* and an emitter lead stripe 24*b* of silicon underneath the corresponding stripes of silicon dioxide 26*a* and 26*b*. (FIGS. 7, 7*a* and 8). The emitter lead stripe 24*b* has a widened end portion 30 covering the emitter opening 18**.

The remaining protective stripes of silicon dioxide **26*a* and 26*b* and the end portion 28 of emitter lead stripe 26*b* are now removed with about a 10-second etch with the same buffered HF etching composition described above. (FIGS. 9 and 10). This brief etching treatment leaves most of the first silicon dioxide layer 16 intact. It also leaves exposed the silicon lead stripes 24*a* and 24*b***.

Now, as shown in FIG. 11, a thin film of nickel 32 is deposited on silicon base stripe **24*a*. This stripe extends into base opening 20 and upon the base electrode surface 22. Another nickel film 34 is deposited on silicon emitter lead stripe 24***b*. The nickel is deposited by immersing the entire unit in a conventional solution for depositing nickel electrolessly on a suitable surface. Such a solution may comprise $NiCl_2{\cdot}6_2\mathbf{0}$, sodium citrate, ammonium chloride and sodium hypophosphite. The nickel deposits only on the silicon and not on the silicon dioxide layer 16.

The nickel films 32 and 34 are sintered at 600°–900° C. for 10–20 minutes to enhance the adherence of the nickel to the silicon.

Finally, solder layers 36 and 38 are deposited on nickel films 32 and 34 by dipping the unit in a bath of molten solder. First the surface to be soldered may be fluxed. The solder may be, for example, 1–5 percent tin and and 99–95 percent lead. The solder bath may be at a temperature of about 350° C.

After the solder has been applied, the unit may be subjected to a cleanup etch with hot sodium hydroxide for 1–2 minutes.

The method which has been described permits use of nickel and solder system contact leads over silicon dioxide passivated surfaces. Deposition of silicon affords a base for the nickel and the nickel affords a base for the solder.

What is claimed is:

1. A method of making electrical connections to a surface portion of a silicon semiconductor device body comprising providing said surface with a passivating layer of silicon dioxide except where electrical contact is desired, depositing either an epitaxial layer or a polycrystalline layer of silicon in desired pattern on said surface, said pattern including a lead to said surface portion where connection is desired, depositing a film of nickel electrolessly on said silicon layer, treating the entire surface of said silicon dioxide layer and said nickel film with molten solder such that said solder adheres to said nickel film but not to said silicon dioxide layer.

2. A method according to claim 1 in which said silicon layer is polycrystalline and said lead includes a portion in contact with silicon body.

3. A method of making ohmic contact to a silicon semiconductor body comprising depositing a first layer of silicon dioxide on a surface of said body, removing part of said first silicon dioxide layer thereby exposing a part of said surface where ohmic contact is desired, depositing a layer of silicon on both the remaining portion of said first silicon dioxide layer and said exposed surface portion, depositing a second layer of silicon dioxide on said silicon layer, removing a portion of said second silicon dioxide layer thereby exposing a portion of said silicon layer, etching away said exposed portion of said silicon layer and exposing a portion of said silicon body, removing the remaining portion of said silicon dioxide layer, depositing nickel electrolessly on the remaining portion of said silicon layer, and exposed portion of the silicon body, and depositing lead solder on said deposited nickel.

* * * * *